United States Patent
Chiu

(10) Patent No.: US 10,790,826 B1
(45) Date of Patent: Sep. 29, 2020

(54) LEVEL SHIFTER WITH LOW POWER CONSUMPTION

(71) Applicant: NOVATEK Microelectronics Corp., Hsin-Chu (TW)

(72) Inventor: Hsiang-Yi Chiu, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/416,261

(22) Filed: May 19, 2019

(51) Int. Cl.
   *H03K 3/012* (2006.01)
   *H03K 19/0175* (2006.01)
   *H03K 19/0185* (2006.01)
   *H03K 3/037* (2006.01)

(52) U.S. Cl.
   CPC ..... *H03K 19/017509* (2013.01); *H03K 3/012* (2013.01); *H03K 3/037* (2013.01); *H03K 19/018507* (2013.01)

(58) Field of Classification Search
   CPC .... H03K 3/012; H03K 3/037; H03K 19/0175; H03K 19/017509; H03K 19/018507
   USPC ..................... 326/80, 81; 327/333
   See application file for complete search history.

(56) References Cited

U.S. PATENT DOCUMENTS

| | | | | |
|---|---|---|---|---|
| 8,044,699 B1* | 10/2011 | Kelly | ............. | H03K 19/018521 327/333 |
| 2003/0048116 A1* | 3/2003 | Suetsugu | ............... | H02M 7/538 327/112 |
| 2006/0001599 A1* | 1/2006 | Onozawa | ............... | G09G 3/296 345/60 |
| 2008/0238514 A1* | 10/2008 | Kim | ......................... | G06F 1/08 327/212 |
| 2008/0278215 A1* | 11/2008 | Sakai | ...................... | H02M 1/08 327/398 |
| 2012/0268182 A1* | 10/2012 | Lee | .................. | H03K 3/356121 327/199 |
| 2014/0292392 A1* | 10/2014 | Akahane | .......... | H03K 17/04123 327/333 |
| 2014/0320180 A1* | 10/2014 | Akahane | .................. | H03K 7/08 327/143 |

* cited by examiner

*Primary Examiner* — William Hernandez
(74) *Attorney, Agent, or Firm* — Winston Hsu

(57) ABSTRACT

A level shifter is disclosed. The level shifter comprises a pulse generating circuit, configured to receive an input signal, and generate a plurality of first-level pulses having a pulse width shorter than a pulse width of the input signal, wherein the input signal swings over a first voltage domain; a pulse transforming circuit, coupled to the pulse generating circuit, configured to generate a plurality of second-level pulses corresponding to the plurality of first-level pulses; and a latching circuit, coupled to the pulse transforming circuit, configured to generate an output signal by latching a status of the output signal in response to the plurality of second-level pulses, wherein the output signal swings over a second voltage domain.

19 Claims, 11 Drawing Sheets

US 10,790,826 B1

LEVEL SHIFTER WITH LOW POWER CONSUMPTION

BACKGROUND OF THE INVENTION

1. Field of the Invention

The present invention relates to a level shifter, and more particularly, to a level shifter with low power consumption.

2. Description of the Prior Art

A level shifter is required whenever a signal must be transferred from one circuit operating at a lower voltage domain to another circuit operating at a higher voltage domain. In typical logic circuits, devices such as logic gates or components operate at lower voltage levels, while devices such as electrically programmable read-only memories (EPROM's) operate at higher voltage levels. As one example, in a first circuit operating at a lower voltage domain, the signal voltage varies between 0 and 5 volts; while in a second circuit operating at a higher voltage domain, the signal voltage varies between 0 and 18 volts. In the latter example, in order to transfer the signal from the first circuit to the second circuit, the peak voltage level of the signal must first be shifted by a voltage level shifter circuit from 5 volts to 18 volts. Tradition level shifter would draw a constant quiescent current, which keeps consuming power when the level shifter operates.

Therefore, how to reduce power consumption for a level shifter is a significant objective in the field.

SUMMARY OF THE INVENTION

It is therefore a primary objective of the present invention to provide a level shifter with low power consumption, to improve over disadvantages of the prior art.

An embodiment of the present invention discloses a level shifter. The level shifter comprises a pulse generating circuit, configured to receive an input signal, and generate a plurality of first-level pulses having a pulse width shorter than a pulse width of the input signal, wherein the input signal swings over a first voltage domain; a pulse transforming circuit, coupled to the pulse generating circuit, configured to generate a plurality of second-level pulses corresponding to the plurality of first-level pulses; and a latching circuit, coupled to the pulse transforming circuit, configured to generate an output signal by latching a status of the output signal in response to the plurality of second-level pulses, wherein the output signal swings over a second voltage domain.

An embodiment of the present invention further discloses a level shifter. The level shifter comprises a pulse transforming circuit, comprising a voltage-to-current converter, configured to convert a plurality of first-level pulses to a current, wherein the plurality of first-level pulses is generated according to an input voltage, and the input voltage swings over the first voltage domain; and a current-to-voltage converter, configured to generate a plurality of second-level pulses according to the current; and a latching circuit coupled to the current-to-voltage converter, configured to generate an output signal by latching a status of the output signal according to the plurality of second-level pulses, wherein the output signal swings over a second voltage domain.

An embodiment of the present invention discloses a level shifter. The level shifter comprises a pulse transforming circuit, comprising a voltage-to-current converter, configured to generate a plurality of currents according to a plurality of first-level pulses, wherein the plurality of first-level pulses is generated according to an input voltage, and the input voltage can swing over a first voltage domain; and a current-to-voltage converter, configured to generate an output signal according to the currents, wherein the output voltage can swing over a second voltage domain; and a pulse generating circuit, receiving the input signal, configured to generate the plurality of first-level pulses according to the input signal, wherein a pulse width of the plurality of first-level pulses is shorter than a pulse width of the input signal.

These and other objectives of the present invention will no doubt become obvious to those of ordinary skill in the art after reading the following detailed description of the preferred embodiment that is illustrated in the various figures and drawings.

DETAILED DESCRIPTION

In the present application, including Descriptions and Claims, the term "coupled" is intended to refer to a direct or an indirect connection means. For example, "a first device being coupled to a second device" can be interpreted as "the first device being directly connected to the second device" or as "the first device being indirectly connected to the second device via other devices or connection means".

Figure 1:
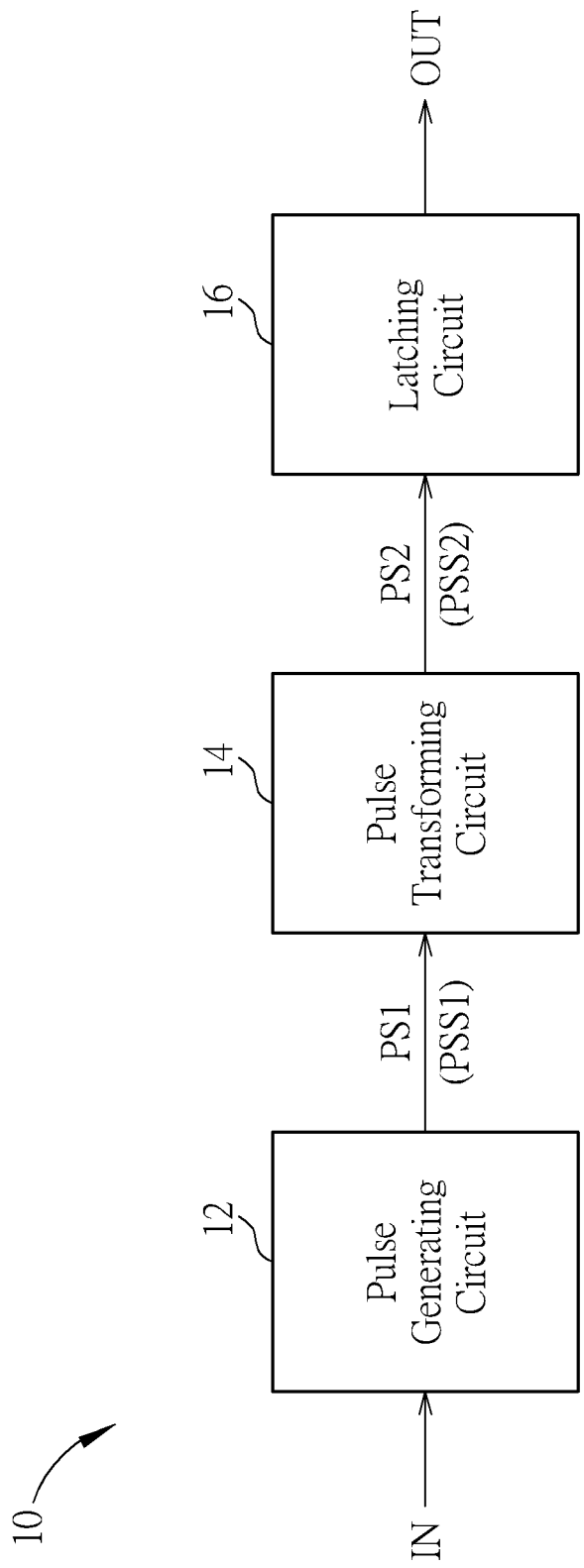
FIG. 1 is a schematic diagram of a level shifter according to an embodiment of the present invention.

FIG. 1 is a schematic diagram of a level shifter 10 according to an embodiment of the present invention. The level shifter 10 comprises a pulse generating circuit 12, a pulse transforming circuit 14 and a latching circuit 16. The pulse generating circuit 12, receiving an input signal IN, is configured to generate a plurality of first-level pulses PS1 (or a first-level pulse signal PSS1 comprising the plurality of first-level pulses PS1) according to the input signal IN. A pulse width of the plurality of first-level pulses PS1 may be shorter than a pulse width of the input signal IN. For example, the first-level pulses PS1 can generated in response to transition or edges of the input signal IN. The input signal IN can swing over a first voltage domain such as a low voltage (LV) domain, where the LV domain is bounded between a logic high voltage VHL and a logic low voltage VLL. The first-level pulse PS1 can also swing over the LV domain. The pulse transforming circuit 14, coupled to the pulse generating circuit 12 to receive the first-level pulse signal PSS1, is configured to generate a plurality of second-level pulses PS2 (or a second-level pulse signal PSS2 comprising the plurality of second-level pulses PS2) according to the plurality of first-level pulses PS1. The second-level pulse PS2 can swing over a second voltage domain such as a high voltage (HV) domain. The HV domain can be bounded between a logic high voltage VHH and a logic low voltage VLH. The pulse transforming circuit 14 can be regarded as transforming the first-level pulses PS1 in the first voltage domain (for example the LV domain) into/as the second-level pulses PS2 in the second voltage domain (for example the HV domain). The latching circuit 16, coupled to the pulse transforming circuit 14, is configured to generate an output signal OUT by latching a status of the output signal OUT in response to the plurality of second-level pulses PS2. The output signal OUT can swing over the HV domain.

As will be described in detail with the following embodiments, the pulse transforming circuit can be configured to be activated intermittently rather than continuously. Due to the pulse generating circuit 32 which may convert the input signal IN into the signal PS1 having shorter pulse widths compared to those of the input signal IN, a current produced by the pulse transforming circuit 14 can therefore be turned on during a high level of the signal PS1 (a pulse time), which for example corresponds to a small transition period of the input signal IN and turned off in the rest time. In other words, the current is off during an interval time between two consecutive first-level pulses PS1. Accordingly, an average of the current can be reduced, resulting in a reduction of power consumption. In addition, the latching circuit can be additionally implemented to latch the status of the output signal OUT in response to the plurality of second-level pulses PS2, meaning that the status of the output signal OUT can be stored even when the current ID is turned off.

Figure 2:
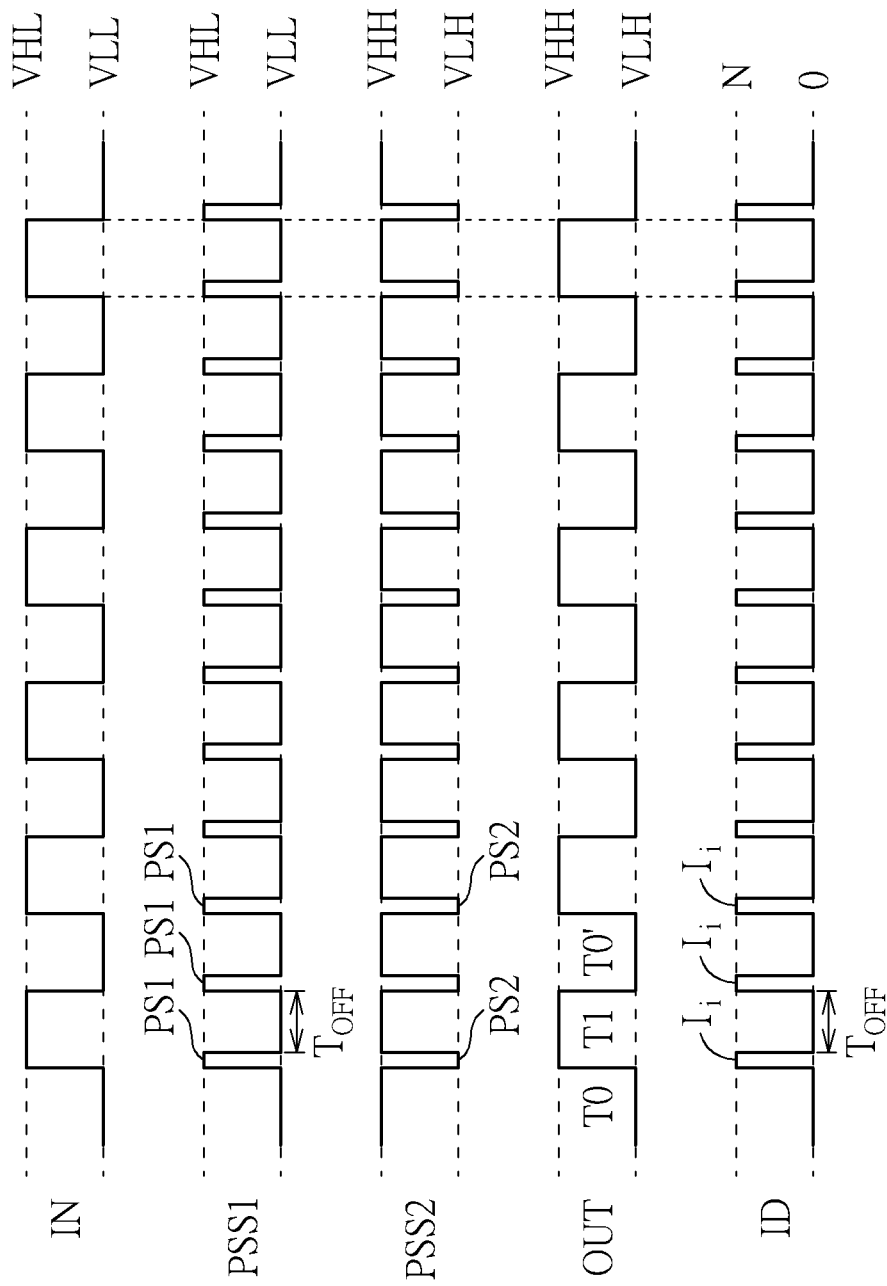
FIG. 2 is a schematic diagram of a plurality of signal waveforms.

FIG. 2 illustrates waveforms of the input signal IN, the first-level pulse signal PSS1, the second-level pulse signal PSS2 and the output signal OUT. As can be seen from FIG. 2, the plurality of first-level pulses PS1 can be generated in response to transition or edges of the input signal IN, and the plurality of second-level pulse PS2 can be generated in response to the plurality of first-level pulses PS1. In the embodiment illustrated in FIG. 2, the plurality of first-level pulses PS1 is in response to both the rising edges and the falling edges of the input signal IN, but not limited thereto. The plurality of first-level pulses PS1 may be in response to either the rising edges or the falling edges of the input signal IN. Once a second-level pulse PS2 is fed to the latching circuit 16, the latching circuit 16 would transit its output voltage, and latch the after-transition output voltage as a steady state until the next second-level pulse PS2 arrives.

Figure 3:
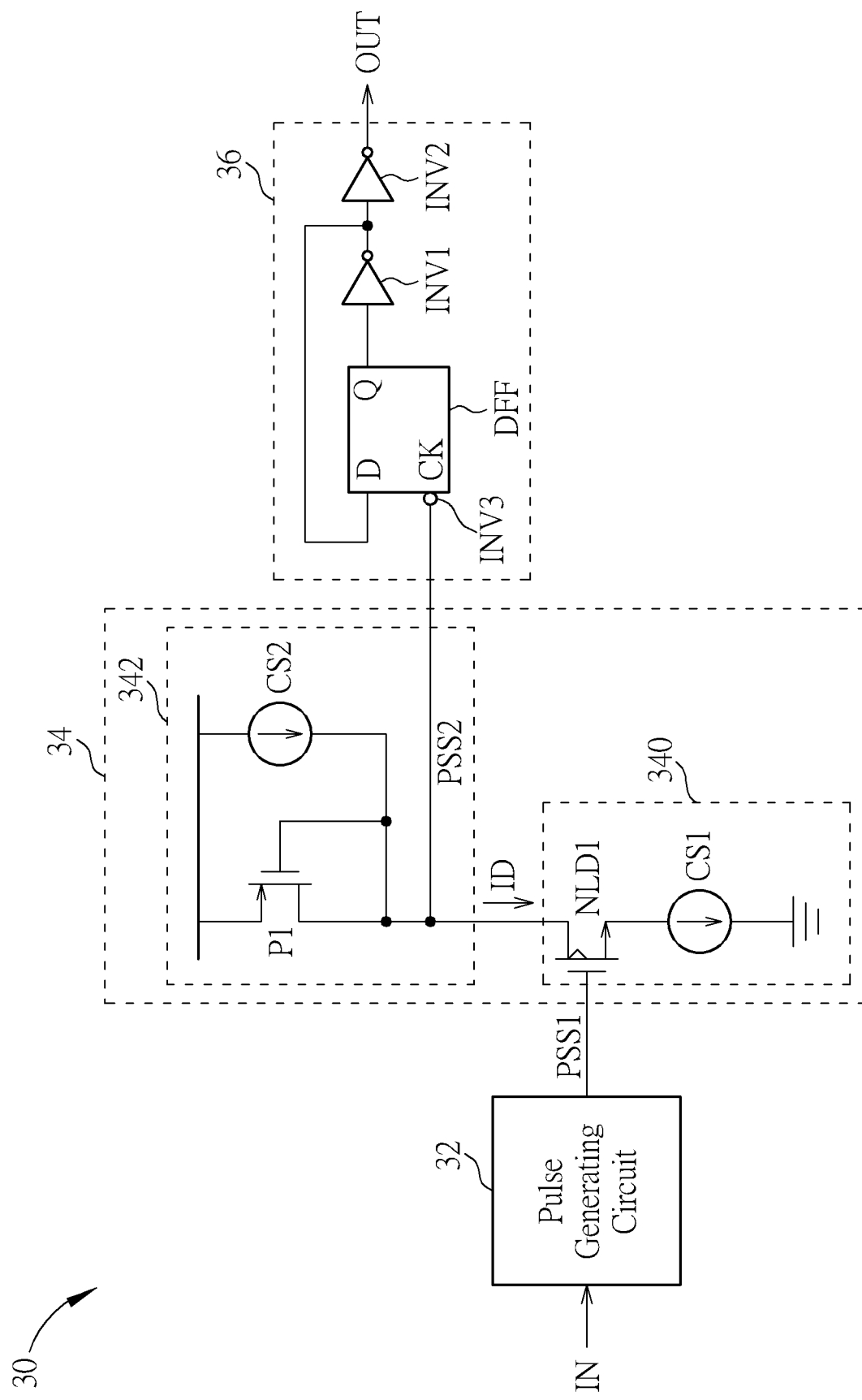
FIG. 3 is a schematic diagram of a level shifter according to an embodiment of the present invention.

FIG. 3 is a schematic diagram of a level shifter 30 according to an embodiment of the present invention. The level shifter 30 comprises a pulse generating circuit 32, a pulse transforming circuit 34 and a latching circuit 36.

The pulse generating circuit 12, receiving an input signal IN, is configured to generate a first-level pulse signal PSS1 comprising the plurality of first-level pulses PS1 according to the input signal IN, which may having the waveforms shown in FIG. 2. The pulse generating circuit 32 can be biased by/between the logic high voltage VHL and the logic low voltage VLL.

The pulse transforming circuit 34 in the embodiment comprises a voltage-to-current converter 340 and a current-to-voltage converter 342. The voltage-to-current converter 340 is configured to drive a current ID, also illustrated in FIG. 2, according to the first-level pulse signal PSS1 in response to both the rising edge and the falling edges of the input signal IN. The current-to-voltage converter 342 is configured to generate the second-level pulse signal PSS2 according to the current ID.

FIG. 3 also shows an exemplary structure for the voltage-to-current converter 340 and the current-to-voltage converter 342. As shown, the voltage-to-current converter 340 may comprise a transistor NLD1 and a current source CS1. The current-to-voltage converter 342 may comprise a transistor P1 and a current source CS2. Connections between the transistors NLD1, P1 and the current sources CS1, CS2 are illustrated in FIG. 3 and not narrated herein for brevity.

When the first-level pulse signal PSS1 is at the logic low voltage VLL, the transistor NLD1 is cut off and the current ID is turned off, resulting in that the second-level pulse signal PSS2 is at the logic high voltage VHH, as shown in FIG. 2. No (quiescent) current and power is consumed in this period (e.g., $T_{OFF}$ illustrated in FIG. 2). On the other hand, when the first-level pulse signal PSS1 is at the logic high voltage VHL, the transistor NLD1 is conducted and the current ID is turned on, leading to power consumption. A plurality of instantaneous currents Ii is generated, by the voltage-to-current converter 340, due to (or in response to) the plurality of first-level pulses PS1. Due to the instantaneous currents Ii, or due to the conduction of the transistor NLD1, the second-level pulse signal PSS2 is pulled low, which may be regarded/viewed as a negative pulse falling from the logic high voltage VHH. In the embodiment illustrated in FIG. 2, the second-level pulse signal PSS2 is pulled low to the logic low voltage VLH when the transistor NLD1 is conducted, but not limited thereto. As long as the second-level pulse signal PSS2 is pulled down to a sufficient low voltage, sufficient to trigger the latching circuit 36 to transit its state, the requirements of the present invention is satisfied.

FIG. 3 also shows an exemplary structure for the latching circuit 36. The latching circuit 36, biased by/between the logic high voltage VHH and the logic low voltage VLH, comprises a delay (or D-type) flip-flop DFF and inverters INV1, INV2, INV3. The flip-flop DFF comprises a flip-flop input (data) terminal D, a clock input terminal CK and a data output terminal Q. The inverter INV3 is illustrated as a circle connecting between the pulse transforming circuit 34 and the clock input terminal CK, configured to provide an inverted second-level pulse $PS2^{(I)}$, a positive pulse rising from the logic low voltage VLH. Connections between the flip-flop DFF and the inverters INV1, INV2, INV3 are illustrated in FIG. 3 and not narrated herein for brevity.

When the first-level pulse signal PSS1 is at the logic low voltage VLL and the second-level pulse signal PSS2 is at the logic high voltage VHH, the data output terminal Q may be assumed to be at the logic low voltage VLH and the output signal OUT would be the logic low voltage VLH, during a time T0 in FIG. 2. Note that, the flip-flop input terminal D is at the logic high voltage VHH in the time T0. When the second-level pulse PS2 arrives, the inverter INV3 would produce the inverted second-level pulse $PS2^{(I)}$, the positive pulse, to trigger the flip-flop DFF and the flip-flop DFF would output the logic high voltage VHH (at the flip-flop input terminal D) to the data output terminal Q, causing the output signal OUT transits its state. Then the output signal OUT is latched to the logic high voltage VHH, during a time T1 in FIG. 2, even the voltage at the flip-flop input terminal D becomes the logic low voltage VLH in the time T1. When the next second-level pulse PS2 comes, the flip-flop DFF would be triggered again and output the logic low voltage VLH at the flip-flop input terminal D to the data output terminal Q. Then the output signal OUT is latched to the logic low voltage VLH, during a time T0' in FIG. 2, even the voltage at the flip-flop input terminal D becomes the logic high voltage VHH in the time T0'. Every time the second-level pulse PS2 comes, the latching circuit 36 would transit the state of the output signal OUT, either from VHH to VLH or from VLH to VHH, and latch the after-transition voltage to form the output signal OUT until the next second-level pulse PS2 arrives. Therefore, the latching circuit 36 can produce the output signal OUT swinging over the HV domain.

Figure 4:
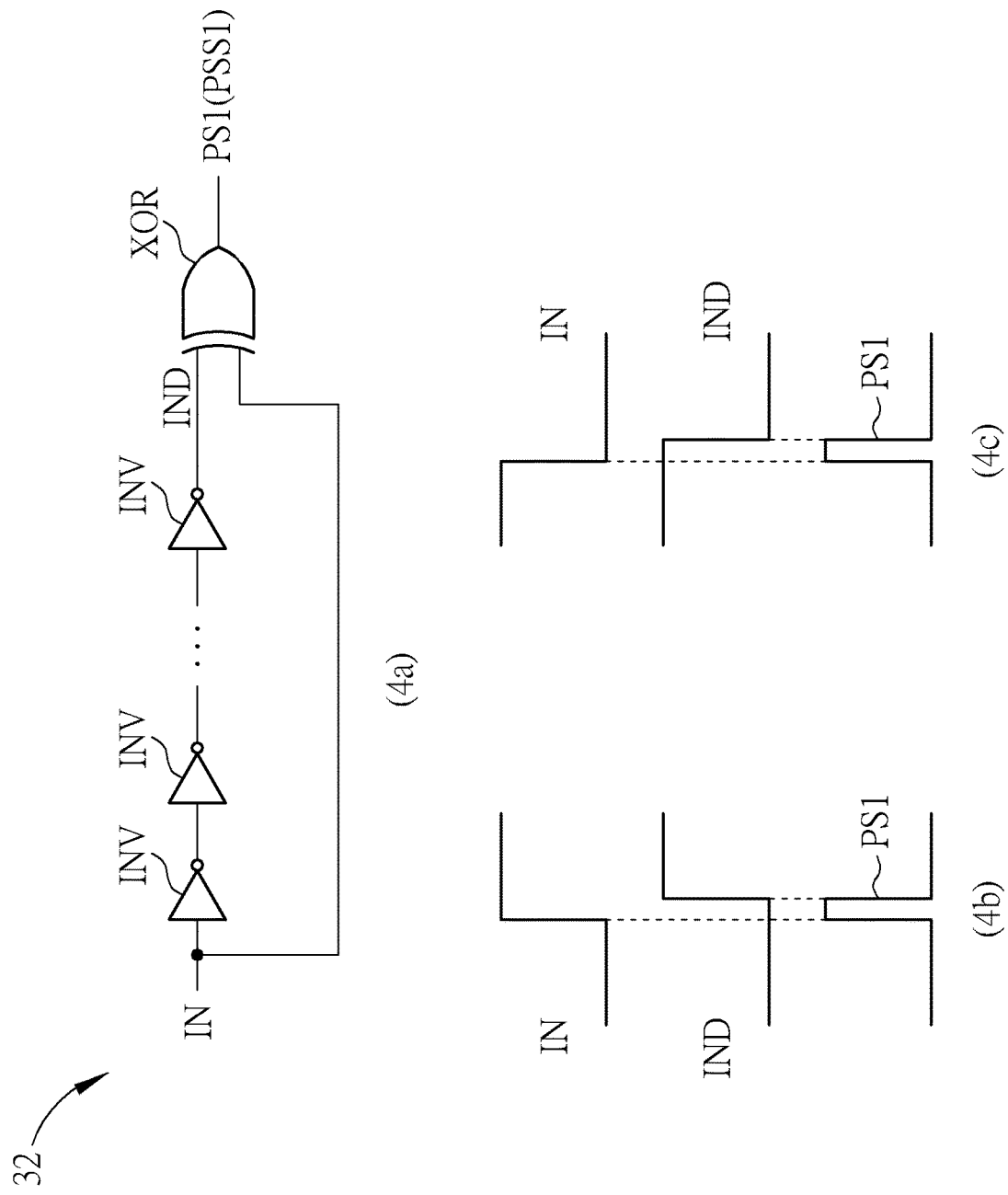
FIG. 4 is a schematic diagram of a pulse generating circuit according to an embodiment of the present invention.

Detail of the pulse generating circuit 32 is illustrated in FIG. 4 according to an embodiment. As the sub-FIG. 4a shows, the pulse generating circuit 32 comprises a plurality of inverters INV and an exclusive OR gate XOR. A number of the plurality of inverters INV can be an even number. The pulse generating circuit 32 is able to generate the first-level pulse(s) PS1 corresponding to the rising edge of the input signal IN, as the sub-FIG. 4b shows. The pulse generating circuit 32 is also able to generate the first-level pulse (s) PS1 corresponding to the falling edge of the input signal IN, as the sub-FIG. 4c shows.

Figure 5:
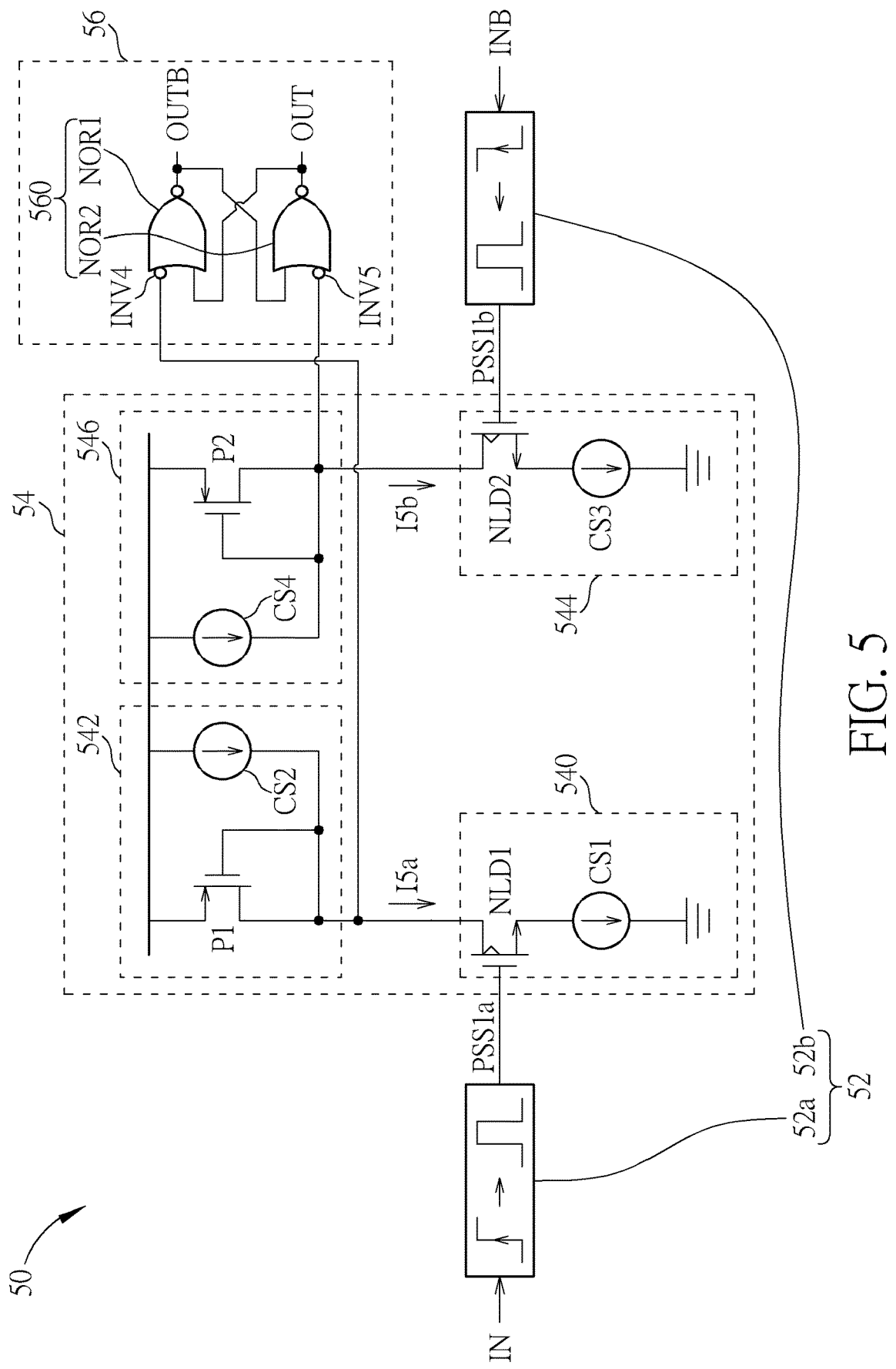
FIG. 5 is a schematic diagram of a level shifter according to an embodiment of the present invention.

It is noted in the embodiment shown in FIG. 3 the level shifter 30 utilizes the delay flip-flop DFF to latch of the after-transition voltage for the output signal OUT, which is not limited thereto. An SR latch may also be used to latch the output voltage. For example, FIG. 5 is a schematic diagram of a level shifter 50 according to an embodiment of the present invention. The level shifter 50 comprises a pulse generating circuit 52, a pulse transforming circuit 54 and a latching circuit 56.

The pulse generating circuit 52, biased by/between the logic high voltage VHL and the logic low voltage VLL, comprises pulse generating sub-circuits 52a and 52b. The pulse generating sub-circuits 52a receives the input signal IN and generates a first-level pulse signal PSS1a. The pulse generating sub-circuits 52b receives an inverted input signal INB and generates a first-level pulse signal PSS1b. The first-level pulse signal PSS1a comprises a plurality of first-level pulses PS1 in response to the rising edges of the input signal IN. The first-level pulse signal PSS1b comprises a plurality of first-level pulses PS1 in response to the falling edges of the input signal IN. The combination of the first-level pulse signals PSS1a and PSS1b may be regarded as the first-level pulse signal PSS1. In addition, an inverter is required to generate the inverted input signal INB from the input signal IN, which is not shown in FIG. 5.

Figure 6:
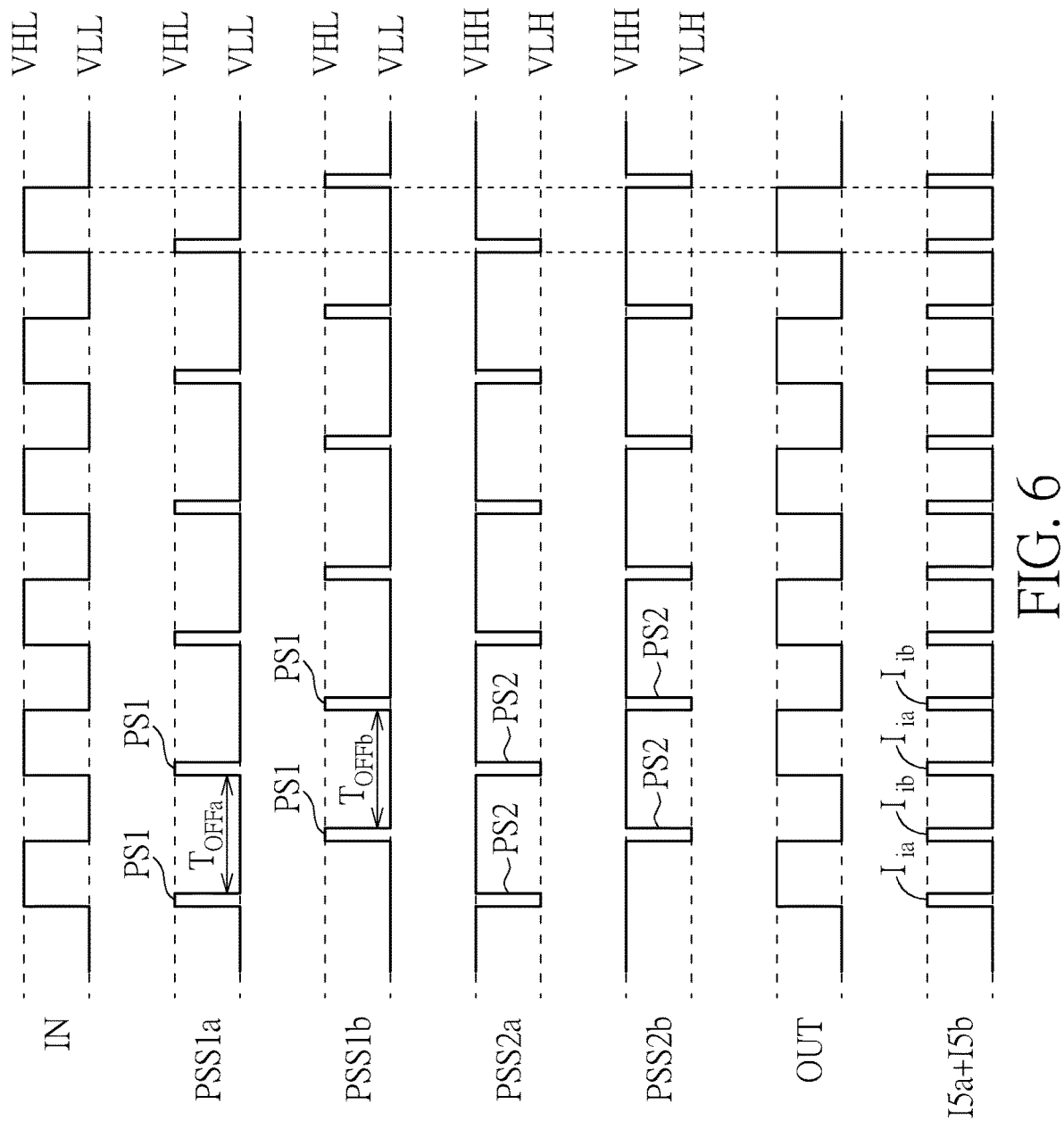
FIG. 6 is a schematic diagram of a plurality of signal waveforms in the level shifter of FIG. 5.

The pulse transforming circuit 54 comprises voltage-to-current converters 540, 544 and current-to-voltage converters 542, 546. The voltage-to-current converters 540, 544 have circuit structures similar to which of the voltage-to-current converter 340, and the current-to-voltage converters 542, 546 similar to which of the current-to-voltage converter 342. The voltage-to-current converters 540, 544 produce current I5a and I5b, respectively, show in FIG. 5. Similar to which of the pulse transforming circuit 34as FIG. 6 shows, a plurality of instantaneous currents Ii$_a$ are driven by the voltage-to-current converter 540 according to the first-level pulses PS1 in response to the rising edges of the input signal IN, and a plurality of instantaneous currents Ii$_b$ are driven by the voltage-to-current converter 544 according to the first-level pulses PS1 in response to the falling edges of the input signal IN. According to the first-level pulse signals PSS1a and PSS1b, the pulse transforming circuit 54 is able to generate second-level pulse signals PSS2a and PSS2b, respectively. The first-level pulse signals PSS1a, PSS1b and the second-level pulse signals PSS2a, PSS2b are also illustrated in FIG. 6. From FIG. 6, the first-level pulse signals PSS1a, PSS1b swing over the LV domain and the second-level pulse signals PSS2a, PSS2b swing over the HV domain.

The latching circuit 56 comprises an SR latch 560 and inverters INV4, INV5. The SR latch comprises two NOR gates, NOR1 and NOR2. The inverters INV4/INV5 is illustrated as a circle connecting between the pulse transforming circuit 54 and the NOR gate NOR1/NOR2. The inverter INV4 is coupled to the current-to-voltage converter 542 to receive the second-level pulse signal PSS2a; the inverter INV5 is coupled to the current-to-voltage converter 546 to receive the second-level pulse signal PSS2b. Details of the connections between the NOR gates NOR1, NOR2 and the inverters INV4, INV5 are illustrated in FIG. 5 and not narrated for brevity.

Similar to the latching circuit 36, every time the second-level pulse PS2 comes, the latching circuit 56 would transit the state of the output signal OUT, either from VHH to VLH or from VLH to VHH, and latch the after-transition voltage of the output signal OUT until the next second-level pulse PS2 comes. Therefore, the latching circuit 56 can produce the output signal OUT swinging over the HV domain. Different from the latching circuit 36, the second-level pulses PS2 in response to the rising edges of the input signal IN (within the second-level pulse signal PSS2a) are fed to a first SR input terminal through the inverter INV4, and the second-level pulses PS2 in response to the falling edges of the input signal IN (within the second-level pulse signal PSS2b) are fed to a second SR input terminal through the inverter INV5. The second-level pulse PS2, either within the second-level pulse signal PSS2a or within the second-level pulse signal PSS2b, would cause the latching circuit 56 to transit the state of the output signal OUT. As illustrated in FIG. 6, the output signal OUT can swing over the HV domain.

Figure 7:
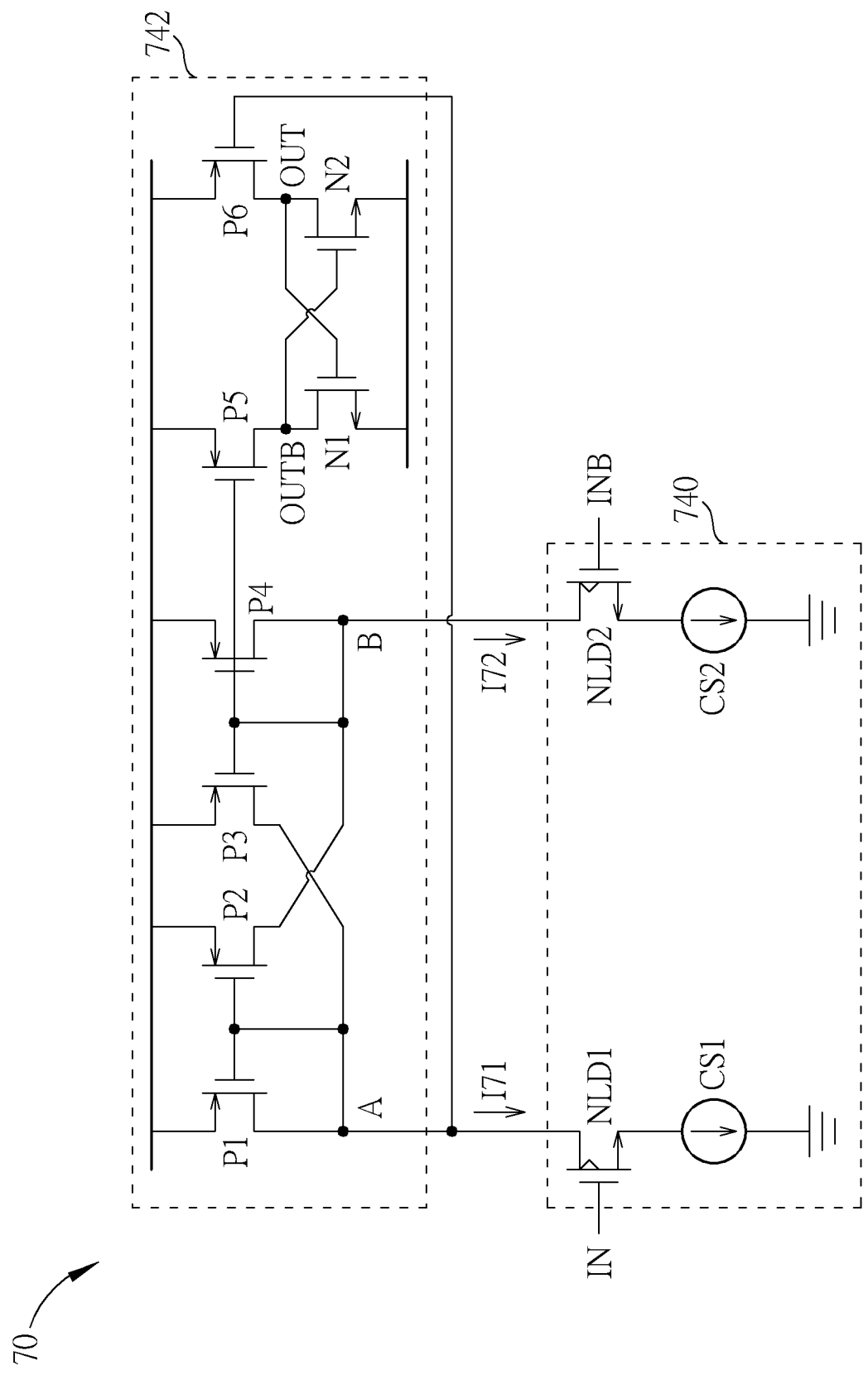
FIG. 7 is a schematic diagram of a level shifter.
Figure 8:
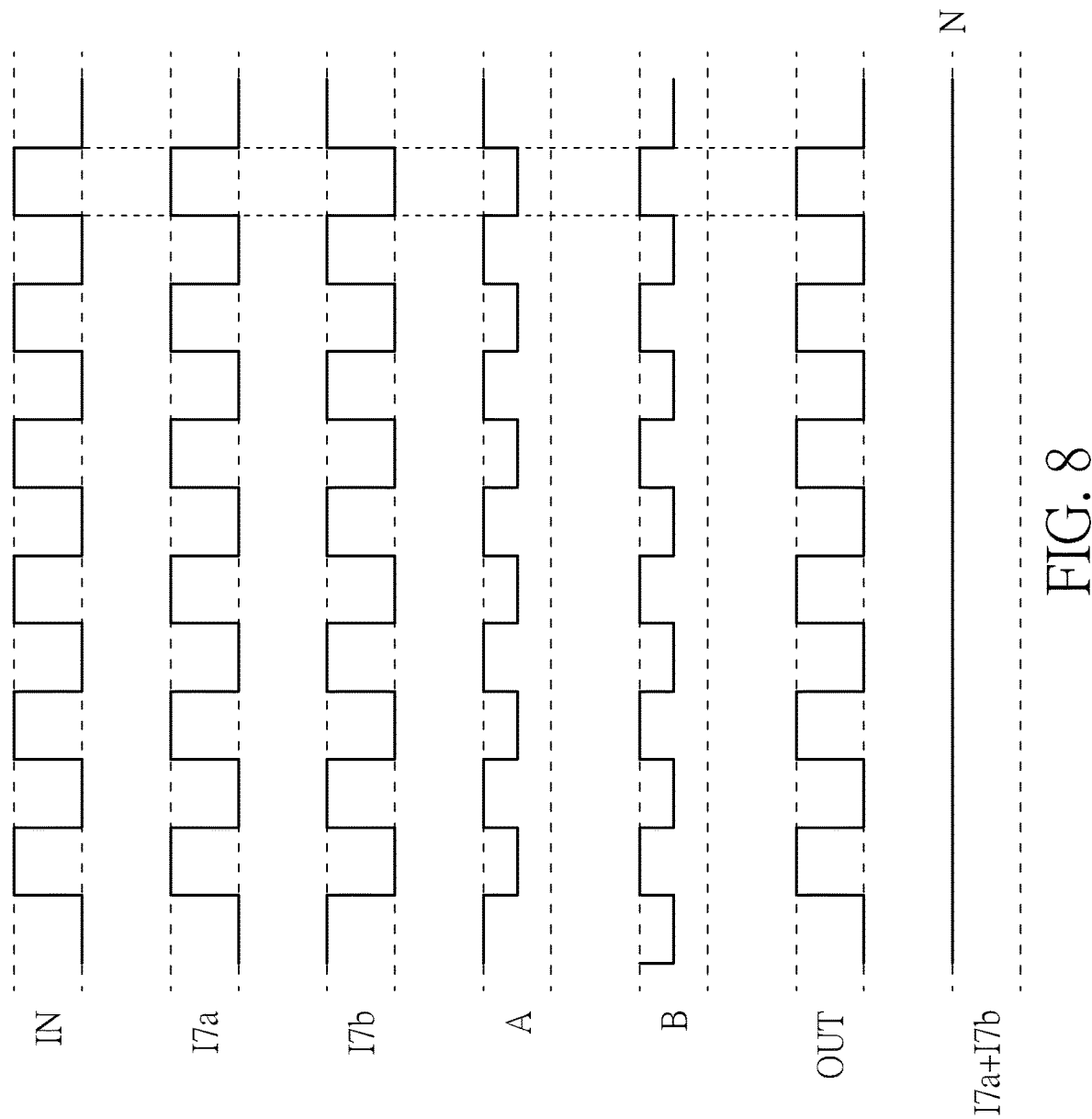
FIG. 8 is a schematic diagram of a plurality of signal waveforms in the level shifter of FIG. 7.

The level shifters 30 and 50 are able to reduce quiescent current consumed by the conventional level shifter, and thereby consume less power. Specifically, FIG. 7 is an exemplary schematic diagram of a level shifter 70. The level shifter 70 comprises a voltage-to-current converter 740 and a current-to-voltage converter 742. In FIG. 7, the voltage-to-current converter 740 comprises transistors NLD1, NLD2 and current sources CS1, CS2. The current-to-voltage converter 742 comprises transistors P1-P6 and N1-N2. Connections between the transistors NLD1, NLD2, P1-P6 and N1-N2 are illustrated in FIG. 7, which are not narrated herein for brevity. The function of the transistor NLD1 and the current source CS1 can be viewed as converting the input signal IN into a current I7a; while the function of the transistor NLD2 and the current source CS2 can be viewed as converting the inverted input signal INB into a current I7b. The current-to-voltage converter 742 can be viewed as converting the currents I7a and I7b into the output signal OUT (and also an inverted output signal OUTB). In the level shifter 70, the current I7a and the current I7b are turned on in an interlaced manner, and a total value of currents I7a+I7b (of the current I7a and the current I7b) remains a nonzero constant, as FIG. 8 illustrates, which means that the level shifter 70 remains a nonzero quiescent current and keeps consuming power when the level shifter 70 operates.

In comparison, in FIG. 5, given the current I5a driven by the voltage-to-current converter 540 and the current I5b driven by the voltage-to-current converter 544, a sum of the current I5a and the current I5b, denoted as I5a+I5b, is illustrated in FIG. 6. Note that, the current I5a/I5b driven by the voltage-to-current converter 540/544 (or produced by the pulse transforming circuit 54) is off during a time $T_{OFFa}$/$T_{OFFb}$ between two consecutive first-level pulses PS1 within the first-level pulse signal PSS1a/PSS1b, as shown in FIG. 6. The total value of currents I5a+I5b represents the current/power consumed when the level shifter 50 operates. By comparing the total value of currents I5a+I5b corresponding to the level shifter 50 with the total value of currents I7a+I7b corresponding to the level shifter 70, it is can be understood that the level shifter 50 consumes less power than the level shifter 70. Numerically, suppose that the power consumption of the level shifter 70 is P and a duty cycle/ratio of the pulse signal (PSS1 or PSS2) is a % (e.g., 5%), the power consumption of the level shifter 70 is 2×a %×P (e.g., 5%×P).

Similarly, the current ID illustrated in FIG. 2 is the current consumed when the level shifter 30 operates. Note that, the current ID driven by the voltage-to-current converter 340 (or produced by the pulse transforming circuit 34) is off during a time $T_{OFF}$ between two consecutive first-level pulses PS1, as shown in FIG. 2. By comparing the current ID corresponding to the level shifter 30 with the total I7a+I7b corresponding to the level shifter 70, it is can be understood that the level shifter 30 consumes less power than the level shifter 70.

As explained in the above that the level shifters 30 and 50 can have reduced quiescent current. The reduction of the quiescent current relies on the OFF period between two consecutive first-level pulses PS1 and also the latching circuit, but not limited thereto.

Figure 9:
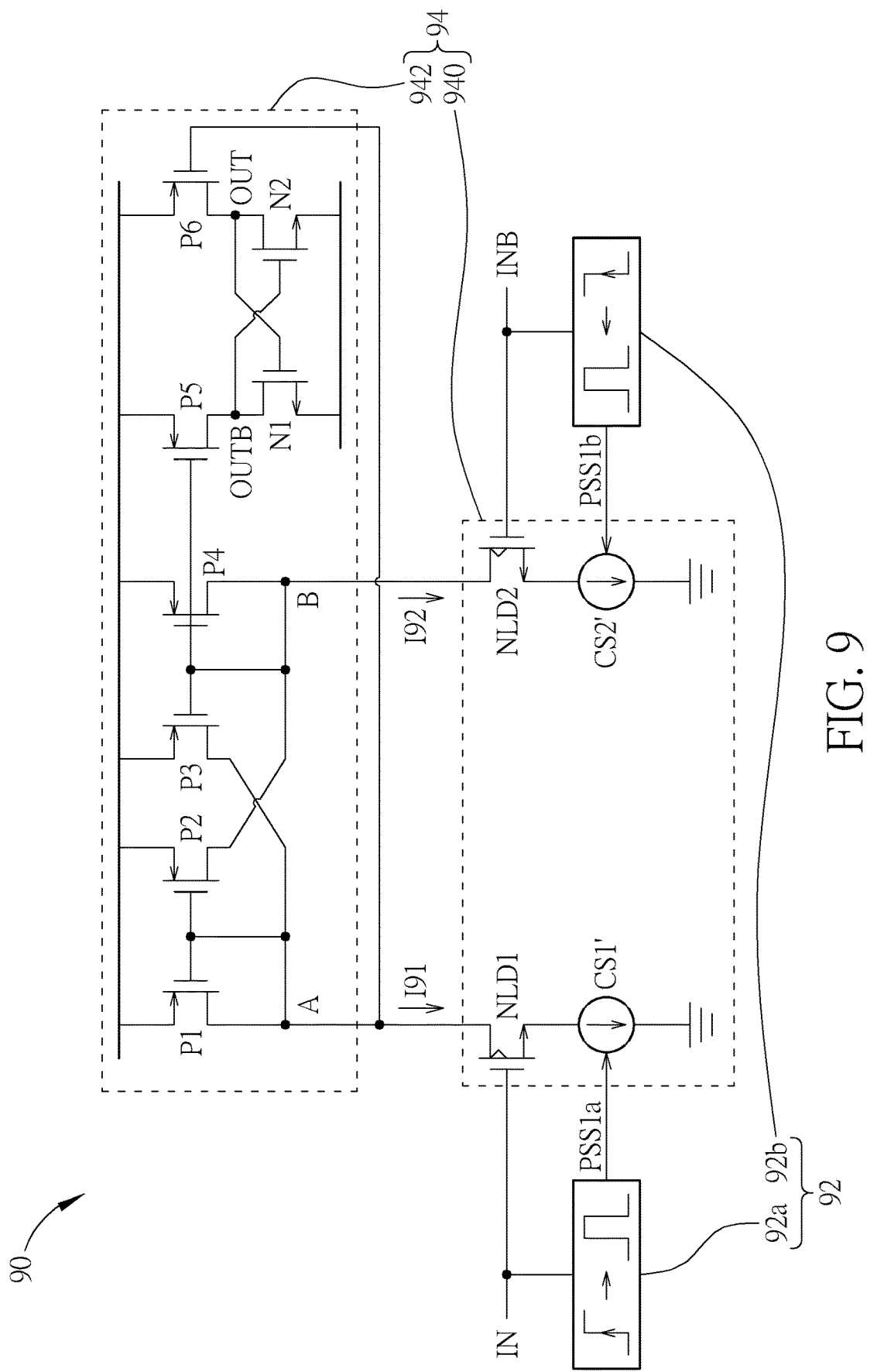
FIG. 9 is a schematic diagram of a level shifter according to an embodiment of the present invention.
Figure 10:
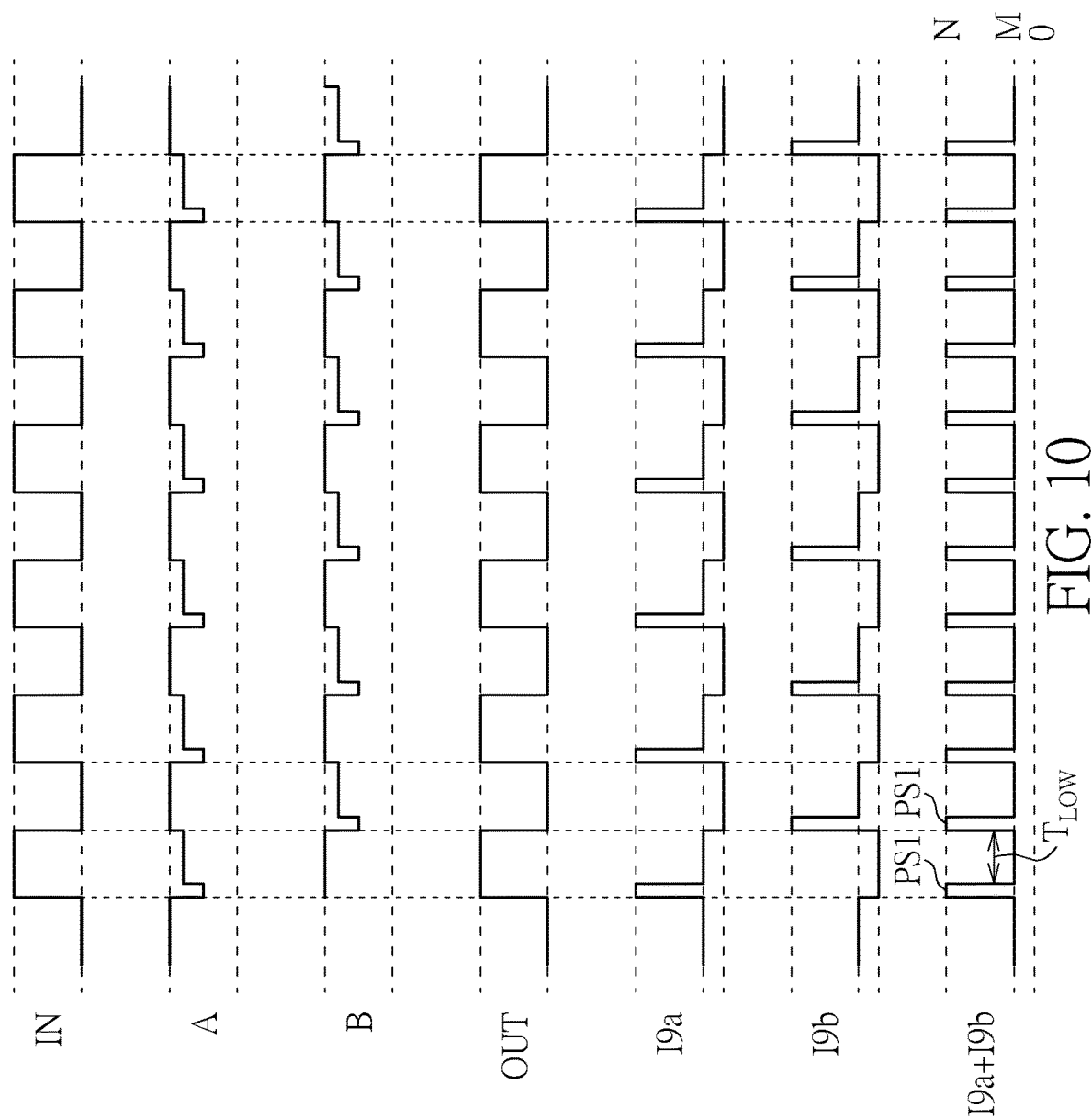
FIG. 10 is a schematic diagram of a plurality of signal waveforms in the level shifter of FIG. 9.

For example, FIG. 9 is a schematic diagram of a level shifter 90 according to an embodiment of the present invention. Similar to the level shifter 70, the level shifter 90 comprises a pulse transforming circuit 94. The pulse transforming circuit 94 comprises a voltage-to-current converter 940 and a current-to-voltage converter 942, where the current-to-voltage converter 942 can have the same circuit structure as the current-to-voltage converter 742, and the voltage-to-current converter 940 can have a structure similar to that of the voltage-to-current converter 740. In addition to the level shifter 70, the level shifter 90 comprising a pulse generating circuit 92. The pulse generating circuit 96 comprises pulse generating sub-circuits 92a and 92b. Different from the current sources CS1 and CS2 in the voltage-to-current converter 740, current sources CS1' and CS2' in the voltage-to-current converter 940 are controlled by the first-level pulse signals PSS1a and PSS1b, respectively. The current sources CS1' and CS2' produce a current I9a and a current I9b, respectively. When the first-level pulse signals PSS1a and PSS1b are at the logic high voltage VHL, a total value of currents I9a+I9b of the current I9a and the current I9b is at a high current level N, as illustrated in FIG. 10. When the first-level pulse signals PSS1a and PSS1b are at the logic low voltage VLL, the total value of currents I9a+I9b of the current I9a and the current I9b is at a low current level M, where M<N. FIG. 10 also illustrates variations in terms of voltage at the terminals A and B in FIG. 9.

Compared to the constant total value of currents I7a+I7b, the total value of currents I9a+I9b is at the low current level M during a time $T_{LOW}$ between two consecutive first-level pulses PS1, with M<N, as illustrated in FIG. 10. The quiescent current is also reduced, compared to the level shifter 70, without using the latch circuit. Therefore, the level shifter 90 would consume less power than the level shifter 70.

Figure 11:
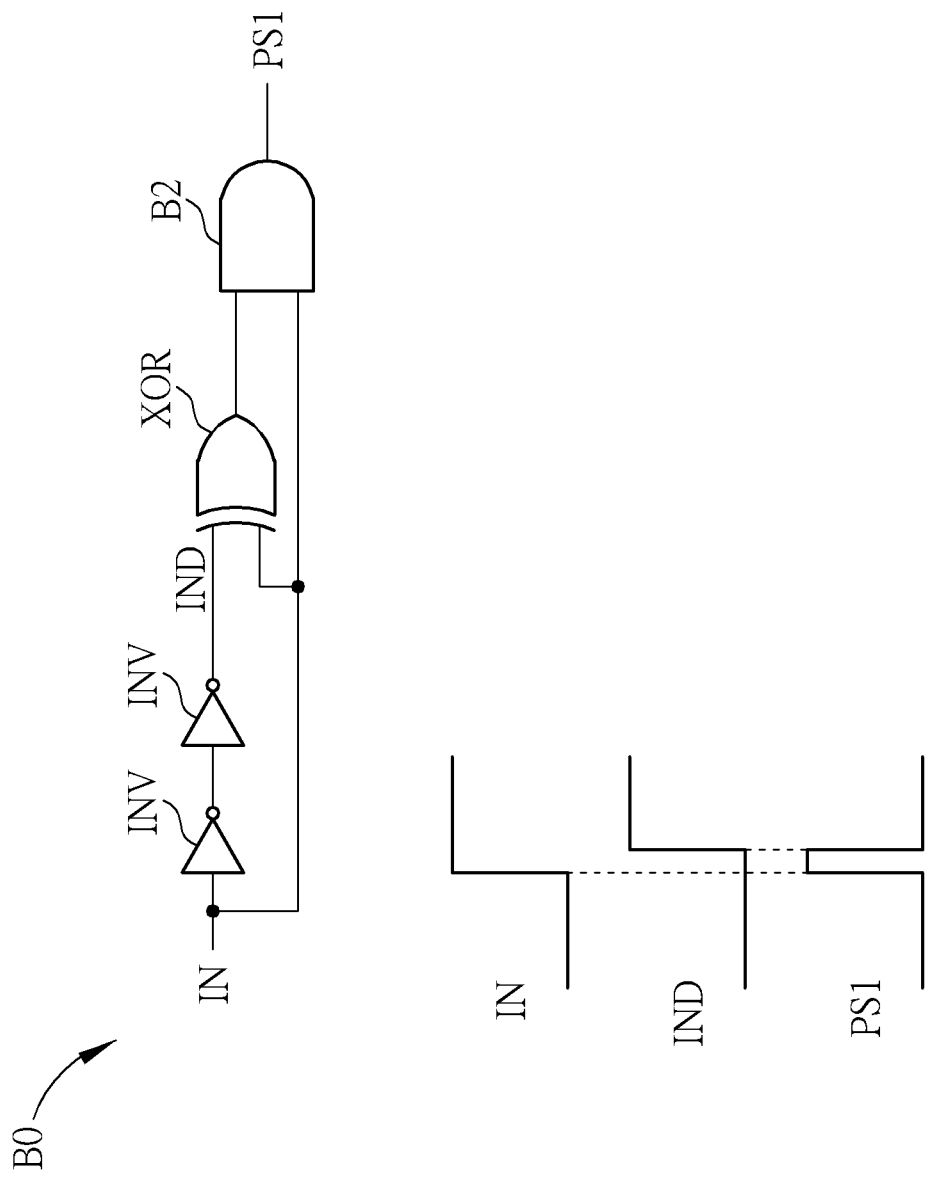
FIG. 11 is a schematic diagram of a pulse generating sub-circuit according to an embodiment of the present invention.

Details of the pulse generating sub-circuits 52a, 52b, 92a, 92b can be referred to FIG. 11. FIG. 11 is a schematic diagram of a pulse generating sub-circuit B0 according to an embodiment of the present invention. The pulse generating sub-circuit B0, similar to the pulse generating circuit 32, can be used to realize the pulse generating sub-circuits 52a, 52b, 92a, 92b, configured to generates the first-level pulse PS1 in response to only the rising edge of the input signal IN. In addition to pulse generating circuit 32, the pulse generating sub-circuit B0 further comprises an AND gate B2. Thus, by the AND gate B2, the first-level pulses PS1 generated by the pulse generating sub-circuit B0 would be only at the rising edge of the input signal IN.

In summary, the embodiments of the present invention may utilize a pulse generating circuit to generate a plurality of first-level pulses, utilizes the pulse transforming circuit to generate a plurality of second-level pulses or the output signal. The current during an interval time between two consecutive first-level pulses may be either turned off or reduced due to the generation of the first-level pulses. Therefore, the level shifter of the embodiments of present invention can reduce quiescent current and also power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A level shifter, comprising:
   a pulse generating circuit, configured to receive an input signal, and generate a plurality of first-level pulses having a pulse width shorter than a pulse width of the input signal, wherein the input signal swings over a first voltage domain;
   a pulse transforming circuit, coupled to the pulse generating circuit, configured to generate a plurality of second-level pulses corresponding to the plurality of first-level pulses; and
   a latching circuit, coupled to the pulse transforming circuit, configured to generate an output signal by latching a status of the output signal in response to the plurality of second-level pulses, wherein the output signal swings over a second voltage domain;
   wherein a power consumption of the pulse transforming circuit depends upon the pulse width of each of the plurality of first-level pulses;
   wherein the first-level pulses switch between a first state and a second state different from the first state, a current produced by the pulse transforming circuit is on for a pulse duration of each first-level pulse of the first-level pulses when the first-level pulses are at the first state and off for a time between two consecutive first-level pulses when the first-level pulses are at the second state.

2. The level shifter of claim 1, wherein the pulse generating circuit is configured to detect a rising edge or a falling edge of the input signal and generate a first-level pulse of the plurality of the first-level pulses in response to the rising edge or the falling edge of the input signal.

3. The level shifter of claim 1, wherein the pulse transforming circuit comprises:

a first voltage-to-current converter, configured to drive a plurality of first instantaneous currents according to a part of or all of the plurality of first-level pulses; and a first current-to-voltage converter, coupled to the first voltage-to-current converter, configured to generate a part of or all of the plurality of second-level pulses according to the plurality of first instantaneous currents.

4. The level shifter of claim 3, wherein the first voltage-to-current converter comprises:

a first current source; and a first transistor, coupled to the first current source and the pulse generating circuit, receiving the part of or all of the plurality of first-level pulses.

5. The level shifter of claim 3, wherein the first current-to-voltage converter comprises a second transistor and a second current source, wherein a gate terminal of the second transistor is coupled to a drain terminal of the second transistor, and the second current source is coupled between the drain terminal and a source terminal of the second transistor.

6. The level shifter of claim 3, wherein the pulse transforming circuit further comprises:

a second voltage-to-current converter, configured to drive a plurality of second instantaneous currents according to a part of the plurality of first-level pulses in response to falling edges of the input signal; and a second current-to-voltage converter, coupled to the second voltage-to-current converter, configured to generate a part of the plurality of second-level pulses in response to the plurality of second instantaneous currents;

wherein the plurality of first instantaneous currents is in response to rising edges of the input signal.

7. The level shifter of claim 6, wherein the second voltage-to-current converter comprises:

a third current source; and a third transistor, coupled to the third current source and the pulse generating circuit, receiving the part of the plurality of first-level pulses.

8. The level shifter of claim 6, wherein the second current-to-voltage converter comprises a fourth transistor and a fourth current source, wherein a gate terminal of the fourth transistor is coupled to a drain terminal of the fourth transistor, and the fourth current source is coupled between the drain terminal and a source terminal of the fourth transistor.

9. The level shifter of claim 6, wherein the latching circuit further comprises:

an SR latch, comprising a first SR input terminal, a second SR input terminal and an SR output terminal;

wherein the first SR input terminal is coupled to the first current-to-voltage converter, the second SR input terminal is coupled to the second current-to-voltage converter, and the SR output terminal is configured to output the output signal.

10. The level shifter of claim 9, wherein the latching circuit comprises:

a fourth inverter, coupled between the first SR input terminal and the first current-to-voltage converter; and a fifth inverter, coupled between the second SR input terminal and the second current-to-voltage converter.

11. The level shifter of claim 1, wherein the latching circuit comprises:

a flip-flop, comprising a flip-flop input terminal, a clock input terminal and a data output terminal, wherein the clock input terminal is coupled to the pulse transforming circuit;

a first inverter, comprising a first inverting input terminal and a first inverting output terminal, wherein the first inverting input terminal is coupled to the data output terminal, and the first inverting output terminal is coupled to the flip-flop input terminal.

12. The level shifter of claim 11, wherein the latching circuit further comprises:

a second inverter, comprising a second inverting input terminal and a second inverting output terminal, wherein the second inverting input terminal is coupled to the first inverting output terminal, and the second inverting output terminal is configured to output the output signal.

13. The level shifter of claim 12, wherein the latching circuit comprises:

a third inverter, coupled to the pulse transforming circuit to receive a second-level pulse and provide an inverted second-level pulse to the clock input terminal.

14. The level shifter of claim 1, wherein the pulse generating circuit comprises:

a plurality of inverters, connected in a series and forming an inverter series, wherein the inverter series comprises an input end and an output end; and a logic gate, comprising a first logic input terminal, a second logic input terminal, wherein the first logic input terminal is coupled to the input end, the second logic input terminal is coupled to the output end.

15. A level shifter, comprising:

a pulse transforming circuit, comprising:

a voltage-to-current converter, configured to convert a plurality of first-level pulses to a current, wherein the plurality of first-level pulses is generated according to an input signal, and the input signal swings over a first voltage domain; and a current-to-voltage converter, configured to generate a plurality of second-level pulses according to the current; and a latching circuit coupled to the current-to-voltage converter, configured to generate an output signal by latching a status of the output signal according to the plurality of second-level pulses, wherein the output signal swings over a second voltage domain;

wherein a power consumption of the pulse transforming circuit depends upon a pulse width of each of the plurality of first-level pulses;

wherein the first-level pulses switch between a first state and a second state different from the first state, the current driven by the voltage-to-current converter is on for a pulse duration of each first-level pulse of the first-level pulses when the first-level pulses are at the first state and off for a time between two consecutive first-level pulses when the first-level pulses are at the second state.

16. The level shifter of claim 15, further comprising a pulse generating circuit, receiving the input signal, configured to generate the plurality of first-level pulses according to the input signal, wherein the pulse width of the plurality of first-level pulses is shorter than a pulse width of the input signal.

17. A level shifter, comprising:

a pulse transforming circuit, comprising:

a voltage-to-current converter, configured to generate a plurality of currents according to a plurality of first-level pulses, wherein the plurality of first-level pulses is generated according to an input signal, and the input signal swings over a first voltage domain; and a current-to-voltage converter, configured to generate an output signal according to the plurality of currents, wherein the output signal swings over a second voltage domain; and at least one pulse generating circuit, receiving the input signal, configured to generate the plurality of first-level pulses according to the input signal, wherein a pulse width of the plurality of first-level pulses is shorter than a pulse width of the input signal;

wherein a power consumption of the pulse transforming circuit depends upon the pulse width of each of the plurality of first-level pulses;

wherein the first-level pulses switch between a first state and a second state different from the first state, a total of the currents is at a first current level for a pulse time of the plurality of first-level pulses when the first-level pulses are at the first state, the total is at a second current level for an interval time between two consecutive first-level pulses when the first-level pulses are at the second state, and the second current level is less than the first current level.

18. A level shifter, comprising:

a pulse generating circuit, configured to receive an input signal, and generate a plurality of first-level pulses having a pulse width shorter than a pulse width of the input signal, wherein the input signal swings over a first voltage domain;

a pulse transforming circuit, coupled to the pulse generating circuit, configured to generate a plurality of second-level pulses corresponding to the plurality of first-level pulses; and a latching circuit, coupled to the pulse transforming circuit, configured to generate an output signal by latching a status of the output signal in response to the plurality of second-level pulses, wherein the output signal swings over a second voltage domain;

wherein the pulse transforming circuit comprises a voltage-to-current converter configured to drive a plurality of instantaneous currents according to the plurality of first-level pulses and a current-to-voltage converter, configured to generate an output signal according to the plurality of instantaneous currents, and the voltage-to-current converter comprises:

a first current source;

a first transistor, coupled between the first current source and the current-to-voltage converter, and having a gate connected to the pulse generating circuit, receiving a first part of the plurality of first-level pulses;

a second current source; and a second transistor, coupled between the second current source and the current-to-voltage converter, and having a gate connected to the pulse generating circuit, receiving a second part of the plurality of first-level pulses.

19. The level shifter of claim 18, wherein the latching circuit comprises:

a flip-flop, comprising a flip-flop input terminal, a clock input terminal and a data output terminal, wherein the clock input terminal is coupled to the pulse transforming circuit;

a first inverter, comprising a first inverting input terminal and a first inverting output terminal, wherein the first inverting input terminal is coupled to the data output terminal, and the first inverting output terminal is coupled to the flip-flop input terminal.

* * * * *